(12) United States Patent
Moore

(10) Patent No.: US 9,985,163 B2
(45) Date of Patent: May 29, 2018

(54) SINGLE PHOTON AVALANCHE DIODE HAVING PULSE SHAPING FILTER

(71) Applicant: STMicroelectronics (Research & Development) Limited, Marlow, Buckinghamshire (GB)

(72) Inventor: John Kevin Moore, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 237 days.

(21) Appl. No.: 15/097,376

(22) Filed: Apr. 13, 2016

(65) Prior Publication Data
US 2017/0301816 A1 Oct. 19, 2017

(51) Int. Cl.
*H01L 31/107* (2006.01)
*H01L 27/144* (2006.01)

(52) U.S. Cl.
CPC ........ *H01L 31/107* (2013.01); *H01L 27/1443* (2013.01)

(58) Field of Classification Search
CPC ............................ H01L 31/107; H01L 27/1443
USPC ...................................................... 250/214 R
See application file for complete search history.

(56) References Cited

U.S. PATENT DOCUMENTS

| 5,998,779 A * | 12/1999 | Kozuka | H04N 5/365 250/208.1 |
| 7,547,872 B2 * | 6/2009 | Niclass | G01T 1/248 250/208.1 |

OTHER PUBLICATIONS

Takai, Isamu et al: "Single-Photon Avalanche Diode with Enhanced NIR-Sensitivity for Automotive LIDAR Systems," Sensors 2016, 16, 459; doi 10.3390/s16040459, www.mdpi.com/journal/sensors, 9 pages.

* cited by examiner

*Primary Examiner* — Seung C Sohn
(74) *Attorney, Agent, or Firm* — Crowe & Dunlevy

(57) ABSTRACT

An electronic device disclosed herein includes a single photon avalanche diode (SPAD) configured to detect an incoming photon and to generate a first pulse signal in response thereto. Pulse shaping circuitry is configured to generate a second pulse signal from the first pulse signal by high pass filtering the first pulse signal. The pulse shaping circuitry includes a transistor drain-source coupled between a first node and a reference node, and a capacitor coupling the first node to an anode of the SPAD.

26 Claims, 6 Drawing Sheets

SINGLE PHOTON AVALANCHE DIODE HAVING PULSE SHAPING FILTER

TECHNICAL FIELD

This disclosure relates to the field of single photon avalanche diodes, and, more particularly, to a pulse shaping filter for a single photon avalanche diode.

BACKGROUND

Single photon avalanche diodes (SPADs) are used in a variety of applications, such as time of flight ranging systems, to detect incoming photons. When impinged upon by an incoming photon, a SPAD in combination with a detection circuit generates an output electrical pulse.

However, these output pulses are relatively "long", lasting on the order of 10 ns or more. Due to these relatively long pulses, depending on the frequency of arrival of incoming photons, it is possible for the distinct output pulses of the SPAD to "pile up". That is, due to the pulse lengths, the time between impinging of individual photons may be less than the length of the pulses, and thus individual events are no longer seen as the pulses overlap one another.

This results in the inability to distinguish the different incoming photons, which can render a time of flight ranging system inaccurate, since such a time of flight ranging system precisely measures the time between emission of a photon and receipt of the photon, after reflection from an object.

To that end, pulse shaping circuits are used to shorten the output pulses from a SPAD. An electronic device including such a pulse shaping circuit is now described with reference to FIG. 1. Here, the electronic device 100 includes a SPAD 102 coupled between a high voltage node VHV and a node N1 at the anode of the SPAD 102. A first transistor T1 is coupled between node N1 and ground and is switched by a signal Vquench, and a second transistor T2 is coupled between the node N1 and a pull up node VANA and is switched by an enable signal EN. An output inverter 104 has an input coupled to the node N1. The voltage at N1 is shown in FIG. 2, labeled as ANODE, and the output voltage output from inverter 104 is shown in FIG. 2, labeled as PIX_OUT. As can be seen, the pulse from PIX_OUT is substantial in duration, which as explained above is undesirable.

Therefore, the electronic device 100 includes a pulse shaper 106 that operates to truncate the PIX_OUT signal so as to produce a signal PS_OUT suitable for use. The pulse shaper 106 includes an inverter 108 receiving the signal PIX_OUT as input, and outputting the signal PS_INT, which is an in inverted version of PIX_OUT, as shown in FIG. 2. A delay block 110 is coupled to the output of the inverter 108 and generates a delayed version of PS_INT, shown as PS_DEL in FIG. 2. The delay block 110 is coupled to an inverting input of an AND gate 112, and the output of the inverter 108 is coupled to a non-inverting input of the AND gate 112. The resulting signal, PS_OUT, is a truncated version of PS_INT, and is suitable for use.

As can be seen from FIG. 1, the pulse shaping circuit 100 utilizes multiple logic components, and therefore consumes an undesirable amount of current and area. Since reductions in both power consumption and area are commercially desirable, new designs of pulse shaping circuits 100 are desired.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

An electronic device disclosed herein includes a single photon avalanche diode (SPAD) configured to detect an incoming photon and to generate a first pulse signal in response thereto. Pulse shaping circuitry is configured to generate a second pulse signal from the first pulse signal by high pass filtering the first pulse signal.

Another embodiment is directed to an electronic device having a photodiode with an anode coupled to a first node and a cathode coupled to a high voltage node. A first resistance is coupled between the first node and a reference node, and a second resistance is coupled between a second node and the reference node. A capacitor is coupled between the first and second nodes. An inverter has an input coupled to the second node and an output generating a pixel output.

A further embodiment is directed to a single photon avalanche diode (SPAD) having an anode coupled to a first node and a cathode coupled to a supply voltage. A first variable resistance is coupled between the first node and a reference node, and a second variable resistance coupled between a second node and the reference node. A capacitor is coupled between the first and second nodes, and an inverter has an input coupled to the second node and an output generating a pixel output.

DETAILED DESCRIPTION

In the following description, numerous details are set forth to provide an understanding of the present disclosure. It will be understood by those skilled in the art, however, that the embodiments of the present disclosure may be practiced without these details and that numerous variations or modifications from the described embodiments may be possible.

Figure 3:
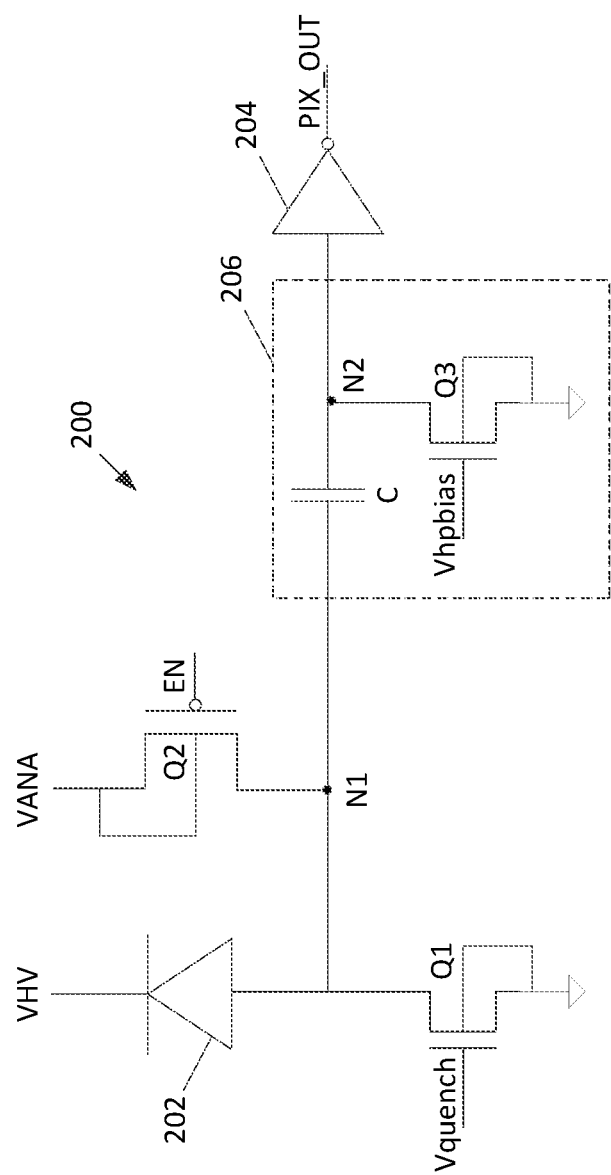
FIG. 3 is a schematic diagram of a single photon avalanche diode pixel having a pulse shaping circuit in accordance with this disclosure.

With reference to FIG. 3, a single photon avalanche diode (SPAD) pixel circuit is now described. The SPAD pixel circuit 200 includes a SPAD 202 having a cathode coupled to a high voltage node VHV and an anode coupled to a node N1. A first transistor Q1 an NMOS transistor having its drain coupled to node N1, its source coupled to the reference node, and its gate coupled to receive a control signal Vquench. A second transistor Q2 is a PMOS transistor having its source coupled to the pull up node VANA, its drain coupled to node N1, and its gate coupled to an enable signal EN.

A pulse shaper 206 is coupled to node N1. The pulse shaper 206 includes a capacitor C coupled between node N1 and a node N2. A third transistor Q3 is an NMOS transistor having its drain coupled to the node N2, its source coupled to the reference node, and its gate coupled to a biasing signal Vhpbias. An inverter 204 has an input coupled to node N2.

Operation of the SPAD pixel circuit 200 is now described. The circuit 200 is capable of operating in a disabled mode and an enabled mode. In the disabled mode, the enable signal EN is low, causing the transistor Q2 to pull the node N1, and thus the anode of the SPAD 202, to the voltage at the pull up node VANA, such that the voltage VHV-VANA is not sufficient to bias the SPAD 202 for avalanche mode; in this mode the pixel Vquench line is connected to ground to prevent a leakage path through Q1. In the disabled mode, the SPAD 202 is therefore between the high voltage VHV and the pull up voltage VANA, and does not generate an output when inpinged upon by an incoming photon.

Figure 4:
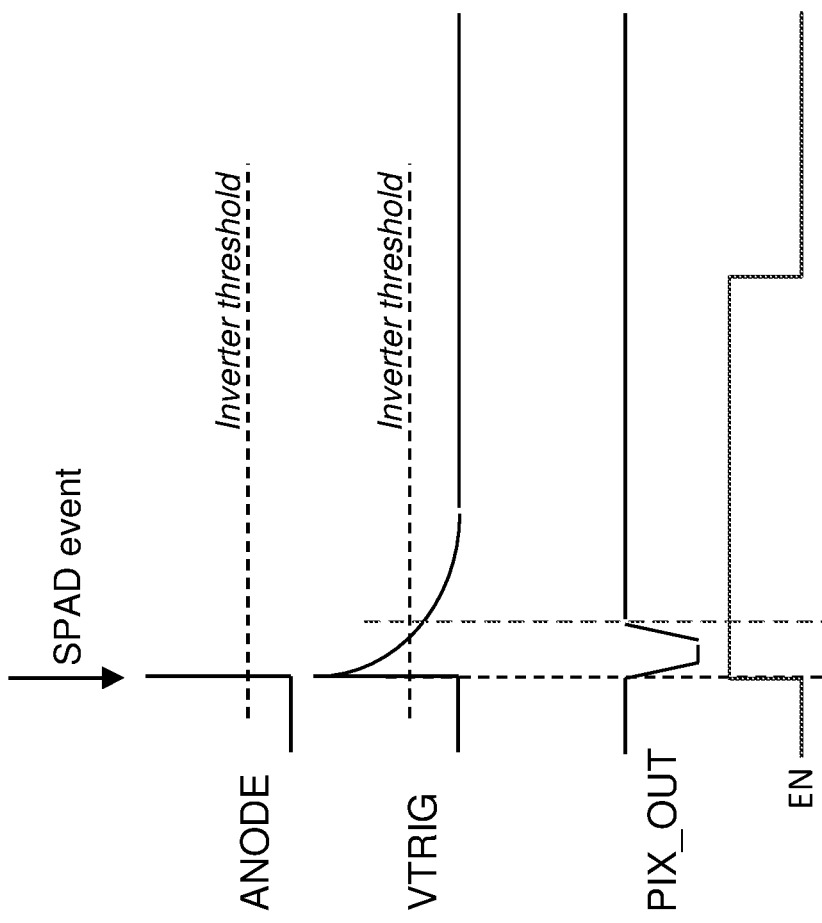
FIG. 4 is a timing diagram of the various signals of the circuit of FIG. 3.

When in the enabled mode, the enable signal EN is high, switching off the transistor Q2. Then, when the SPAD 202 is impinged upon by an incoming photon, it generates a pulse at node N1, which is represented in the graph of FIG. 4 as ANODE. The RC time constant, or time for the signal ANODE at node N1 to fall below the threshold of the inverter 204, is set by the resistance of transistor Q1, to secure a robust SPAD quenching operation, and is undesirably long.

Therefore, the pulse shaper 206 is used. The capacitor C blocks the DC component but allows the fast rising edge on the ANODE at SPAD event to pass to node N2. The transistor Q3 serves to sink current from the node N2, the signal of which is represented in the graph of FIG. 4 as VTRIG. The rate at which the transistor Q3 sinks current from the node N2 depends upon the resistance between its drain and source, which is adjusted via application of the bias signal VHPBIAS to its gate.

Figure 5:
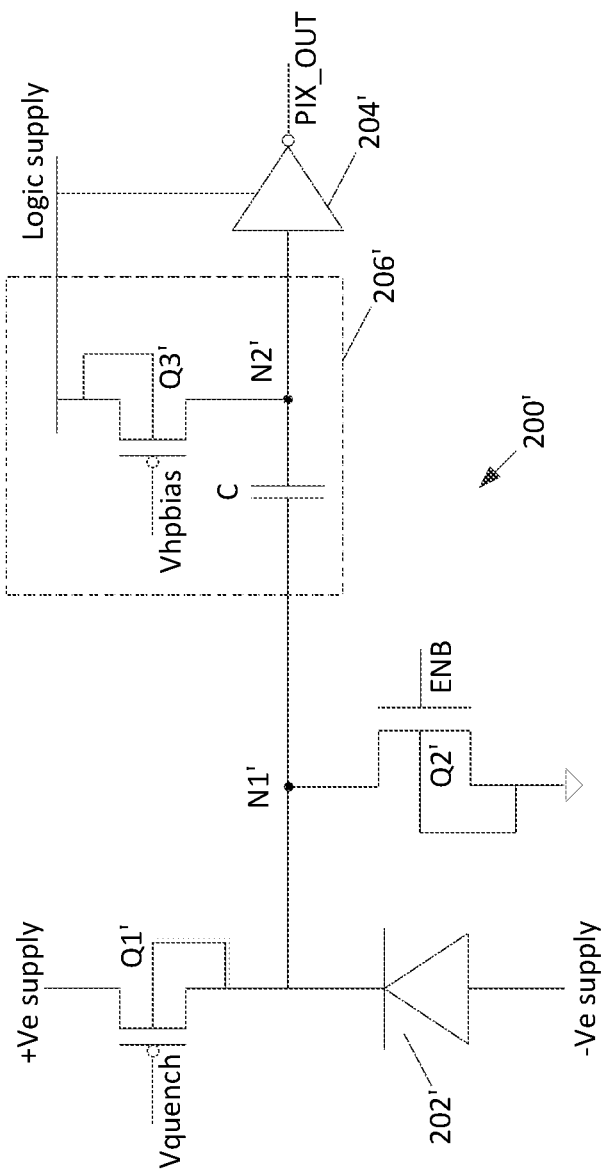
FIG. 5 is a schematic diagram of another embodiment of a single photon avalanche diode pixel having a pulse shaping circuit in accordance with this disclosure.

The RC time constant of the signal VTRIG at node N2 is dominated by the total capacitance at node N2 and the resistance between the drain and source of transistor Q3. Via careful selection of the capacitance of the capacitor C, and of the biasing voltage VHPBIAS, the width of the pulse of the signal VTRIG can thus be adjusted. The processed signal VTRIG is fed to the input of the inverter 204, and then output, represented as the signal PIX_OUT in FIG. 5.

In addition, the "dead" time of the SPAD 202 can be adjusted via selection of the quench signal VQUENCH, which adjusts the resistance between the drain and source of transistor Q1, and therefore the discharge rate of the anode of the SPAD 202.

Figure 1:
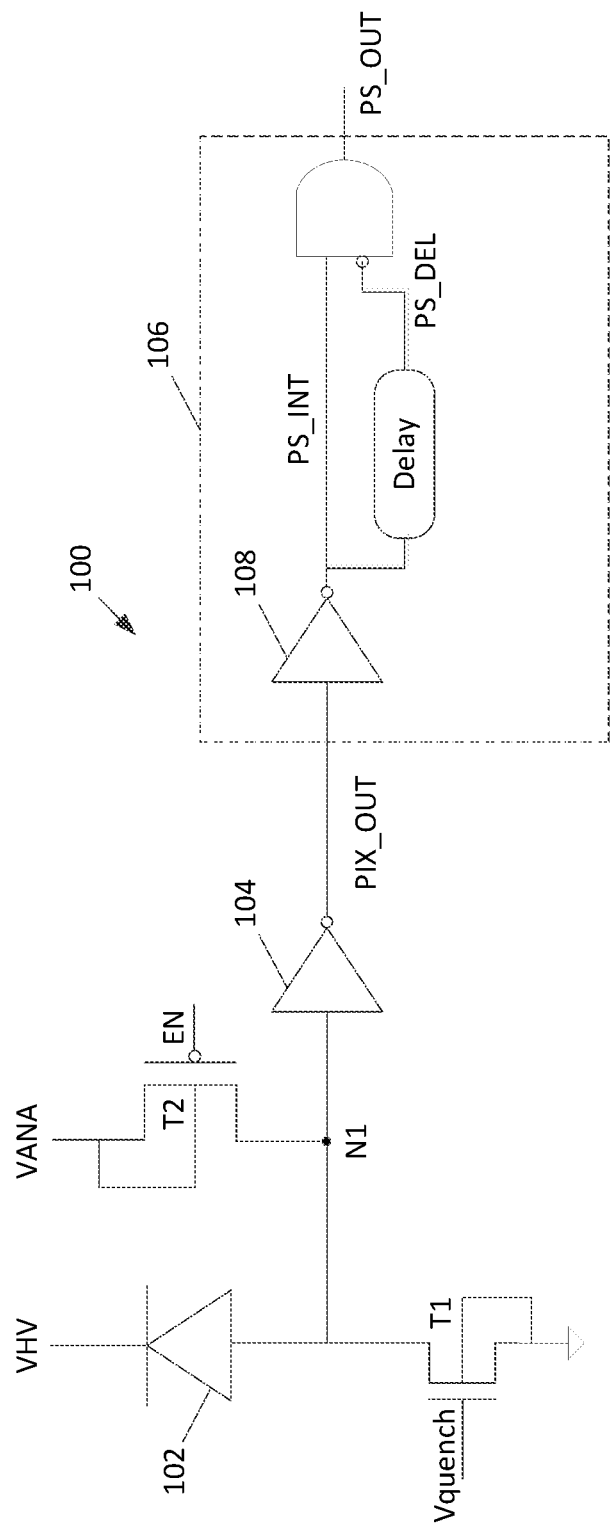
FIG. 1 is a schematic diagram of a prior art single photon avalanche diode pixel having a pulse shaping circuit.
Figure 2:
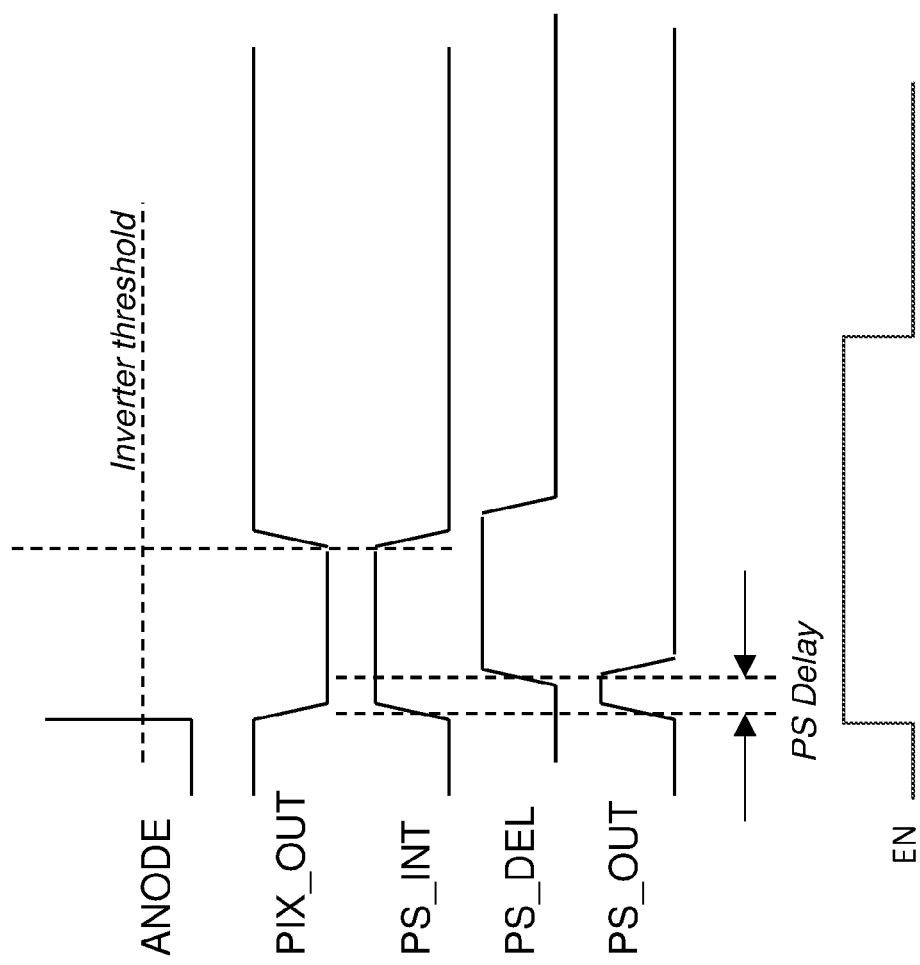
FIG. 2 is a timing diagram of the various signals of the circuit of FIG. 1.

This pulse shaper 206 provides for a properly shaped output signal of a desired length, and does so with low area overhead and low power consumption through the use of a sole and only transistor Q3 plus capacitor C, as opposed to the prior art design of FIG. 1, the logic components of which utilize multiple transistors. The capacitor can be implemented as a MIM or MOM structure over existing pixel circuitry, requiring no additional area. Thus, the physical size of the SPAD pixel circuit 200, and the power consumption thereof, can be reduced utilizing the devices described herein.

As should be readily appreciated, the SPAD may instead be coupled to a negative supply, and the circuit adjusted accordingly. Such an embodiment is now described with reference to FIG. 5.

Here, the SPAD pixel circuit 200' includes a SPAD 202' having its anode coupled to a negative voltage node −Ve and a cathode coupled to node N1'. The first transistor Q1' is a PMOS transistor having its drain coupled to node N1', its source coupled to a positive supply node +Ve, and its gate coupled to receive the control signal Vquench. The second transistor Q2' is an NMOS transistor having its source coupled to the reference node, its drain coupled to node N1', and its gate coupled to the enable signal ENB.

The pulse shaper 206' is coupled to node N1'. The pulse shaper 206' includes a capacitor C coupled between node N1' and node N2'. The third transistor Q3' is a PMOS transistor having its drain coupled to the node N2', its source coupled to a logic supply, and its gate coupled to a biasing signal Vhpbias. The inverter 204' has an input coupled to the node N2' and a supply terminal coupled to the logic supply.

Figure 6:
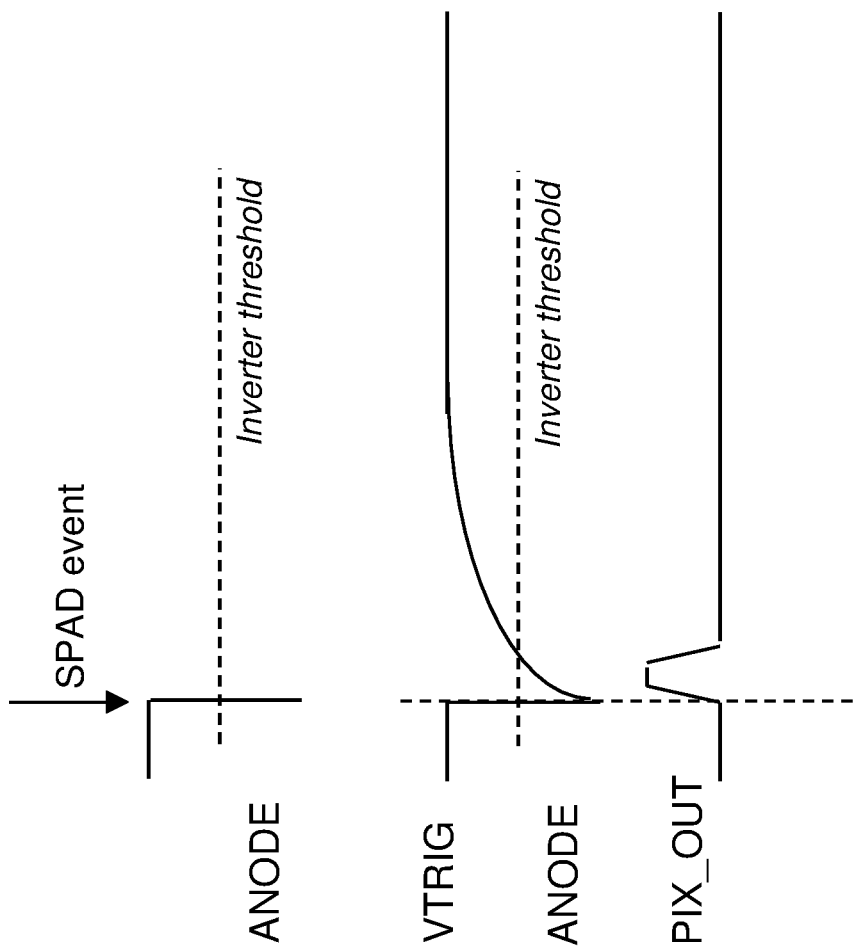
FIG. 6 is a timing diagram of the various signals of the circuit of FIG. 5.

Operation of the SPAD pixel circuit 200' proceeds similarly to that of the SPAD pixel circuit 200. With reference to FIG. 6, in operation when the SPAD 202' is impinged upon by an incoming photon, it generates a pulse at node N1', pulling N1' low, which is represented in the graph of FIG. 6 as ANODE. The RC time constant, or time for the signal ANODE at node N1' to rise above the threshold of the inverter 204', is set by the resistance of transistor Q1', to secure a robust SPAD quenching operation. The capacitor C blocks the DC component but allows the fast falling edge on the ANODE at SPAD event to pass to node N2'. The transistor Q3' serves to source current to the node N2', the signal of which is represented in the graph of FIG. 4 as VTRIG. The rate at which the transistor Q3' sources current to the node N2' depends upon the resistance between its drain and source, which is adjusted via application of the bias signal VHPBIAS to its gate. The processed signal VTRIG is fed to the input of the inverter 204', and then output, represented as the signal PIX_OUT in FIG. 6.

Although the preceding description has been described herein with reference to particular means, materials and embodiments, it is not intended to be limited to the particulars disclosed herein; rather, it extends to all functionally equivalent structures, methods, and uses, such as are within the scope of the appended claims.

The invention claimed is:

1. An electronic device, comprising:
   a photodiode having a first terminal coupled to a first node and a second terminal coupled to a first voltage supply node;
   a first resistance coupled between the first node and a second voltage supply node;
   a second resistance coupled between a second node and a third voltage supply node;
   a capacitor coupled between the first and second nodes; and
   an inverter having an input coupled to the second node and an output generating a pixel output.

2. The electronic device of claim 1, wherein the first terminal of the photodiode comprises an anode; wherein the second terminal of the photodiode comprises a cathode; wherein the first voltage supply node comprises a high voltage node; wherein the second voltage supply node comprises a reference node; and wherein the third voltage supply node comprises the reference node.

3. The electronic device of claim 1, wherein the first terminal of the photodiode comprises a cathode; wherein the second terminal of the photodiode comprises an anode; wherein the first voltage supply node comprises a negative voltage supply node; wherein the second voltage supply node comprises a high voltage supply node; and wherein the third voltage supply node comprises a logic supply node.

4. The electronic device of claim 1, wherein the first resistance comprises a first transistor having a second conduction terminal coupled to the first node, a first conduction terminal coupled to the second voltage supply node, and a control terminal coupled to receive a quench voltage.

5. The electronic device of claim 1, wherein the second resistance comprises a second transistor having a second conduction terminal coupled to the second node, a first conduction terminal coupled to the third voltage supply node, and a control terminal coupled to receive a bias voltage.

6. The electronic device of claim 5, wherein a capacitance of the capacitor is greater than a capacitance of the second transistor.

7. An electronic device, comprising:
a photodiode having an anode coupled to a first node and a cathode coupled to a high voltage node;
a first resistance coupled between the first node and a reference node;
a second resistance coupled between a second node and the reference node;
a capacitor coupled between the first and second nodes; and
an inverter having an input coupled to the second node and an output generating a pixel output.

8. The electronic device of claim 7, wherein the first resistance comprises a first transistor having a first conduction terminal coupled to the first node, a second conduction terminal coupled to the reference node, and a control terminal coupled to receive a quench voltage.

9. The electronic device of claim 7, wherein the second resistance comprises a second transistor having a first conduction terminal coupled to the second node, a second conduction terminal coupled to the reference node, and a control terminal coupled to receive a bias voltage.

10. The electronic device of claim 9, wherein a capacitance of the capacitor is greater than a capacitance of the second transistor.

11. The electronic device of claim 7, wherein the diode comprises a single photon avalanche diode.

12. An electronic device, comprising:
a single photon avalanche diode (SPAD) configured to detect an incoming photon and to generate a first pulse signal in response thereto; and
pulse shaping circuitry configured to generate a second pulse signal from the first pulse signal by high pass filtering the first pulse signal.

13. The electronic device of claim 12, wherein the pulse shaping circuitry comprises:
a transistor drain-source coupled between a first node and a reference node; and
a capacitor coupling the first node to an anode of the SPAD.

14. The electronic device of claim 13, wherein the pulse shaping circuitry further comprises an inverter having an input coupled to the first node.

15. The electronic device of claim 13, wherein the pulse shaping circuitry further comprises an additional transistor drain-source coupled between the anode of the SPAD and the reference node.

16. The electronic device of claim 14, wherein the pulse shaping circuitry further comprises a quench voltage line coupled to a gate of the additional transistor and configured to carry a quench voltage thereto for adjusting a resistance across the additional transistor.

17. The electronic device of claim 13, wherein the pulse shaping circuitry further comprises a bias voltage line coupled to a gate of the transistor and configured to carry a bias voltage thereto for adjusting a resistance across the transistor.

18. The electronic device of claim 13, further comprising an enable circuit coupled between the anode of the SPAD and a pull up node and configured to selectively couple the anode of the SPAD to the pull up node based on an enable signal.

19. The electronic device of claim 18, wherein the enable circuit comprises a transistor drain-source coupled between the anode of the SPAD and the pull up node and having a gate coupled to receive the enable signal.

20. The electronic device of claim 12, wherein the SPAD has a cathode coupled to a high voltage node.

21. An electronic device, comprising:
a single photon avalanche diode (SPAD) having an anode coupled to a first node and a cathode coupled to a supply voltage;
a first variable resistance coupled between the first node and a reference node;
a second variable resistance coupled between a second node and the reference node;
a capacitor coupled between the first and second nodes; and
an inverter having an input coupled to the second node and an output generating a pixel output.

22. The electronic device of claim 21 further comprising an enable circuit coupled between the first node and a pull up node.

23. The electronic device of claim 22, wherein the enable circuit comprises a PMOS transistor having a source coupled to the pull up node, a drain coupled to the first node, and a gate coupled to receive an enable signal.

24. The electronic device of claim 21, wherein the first variable resistance comprises a first NMOS transistor having a drain coupled to the first node, a source coupled to the reference node, and a gate coupled to receive a quench voltage.

25. The electronic device of claim 21, wherein the second variable resistance comprises a second NMOS transistor having a drain coupled to the second node, a source coupled to the reference node, and a gate coupled to receive a bias voltage.

26. The electronic device of claim 21, wherein the anode of the SPAD is directly coupled to the first node; wherein the capacitor is directly coupled between the first node and second node; and wherein the input of the inverter is directly coupled to the second node.

* * * * *